United States Patent
Noh et al.

(10) Patent No.: US 9,991,369 B2
(45) Date of Patent: Jun. 5, 2018

(54) ESD PROTECTION SCR DEVICE

(71) Applicant: DONGBU HITEK CO., LTD., Seoul (KR)

(72) Inventors: Seok Soon Noh, Gyeonggi-do (KR); Jong Min Kim, Seoul (KR); Joon Tae Jang, Seoul (KR); Joong Hyeok Byeon, Gyeonggi-do (KR)

(73) Assignee: DONGBU HITEK CO., LTD, Seoul (KR)

( * ) Notice: Subject to any disclaimer, the term of this patent is extended or adjusted under 35 U.S.C. 154(b) by 0 days. days.

(21) Appl. No.: 15/695,693

(22) Filed: Sep. 5, 2017

(65) Prior Publication Data

US 2018/0069111 A1    Mar. 8, 2018

(30) Foreign Application Priority Data

Sep. 7, 2016  (KR) ......................... 10-2016-0115022

(51) Int. Cl.
*H01L 29/06* (2006.01)
*H01L 29/747* (2006.01)
*H01L 29/74* (2006.01)
*H01L 27/02* (2006.01)

(52) U.S. Cl.
CPC ...... *H01L 29/7436* (2013.01); *H01L 27/0262* (2013.01); *H01L 29/0649* (2013.01)

(58) Field of Classification Search
CPC ......... H01L 29/76; H01L 27/02; H01L 27/06; H01L 27/082; H01L 27/0649; H01L 27/0262; H01L 29/06; H01L 29/66; H01L 29/73; H01L 29/78; H01L 29/861; H01L 29/788; H01L 29/747; H01L 29/0649
USPC ......................................................... 257/133
See application file for complete search history.

(56) References Cited

U.S. PATENT DOCUMENTS

| 2006/0223257 | A1* | 10/2006 | Williams | .......... H01L 21/26513 438/202 |
| 2011/0176244 | A1* | 7/2011 | Gendron | ............. H01L 27/0259 361/56 |
| 2011/0303947 | A1* | 12/2011 | Salcedo | ............. H01L 27/0259 257/173 |

* cited by examiner

*Primary Examiner* — Chuong A Luu
(74) *Attorney, Agent, or Firm* — Patterson Thuente Pedersen, P.A.

(57) ABSTRACT

An ESD protection SCR device includes a semiconductor substrate, an epitaxial layer, device isolation layers, an n-type well formed in an anode region, a first high concentration p-type impurity region formed on a surface portion of the n-type well, a first high concentration n-type impurity region formed on the surface portion of the n-type well, a p-type well formed in an cathode region, a second high concentration n-type impurity region formed on a surface portion of the p-type well, a second high concentration p-type impurity region formed on a surface portion of the p-type well so as to be spaced apart from the second high concentration n-type impurity region, and a third high-concentration p-type impurity region formed on the surface portion of the p-type well so as to surround a side portion of the second high-concentration n-type impurity region, adjacent to the anode region.

12 Claims, 5 Drawing Sheets

ESD PROTECTION SCR DEVICE

CROSS-REFERENCE TO RELATED APPLICATION

This application claims priority to Korean Patent Application No. 10-2016-0115022, filed on Sep. 7, 2016 and all the benefits accruing therefrom under 35 U.S.C. § 119, the contents of which are incorporated by reference in their entirety.

TECHNICAL FIELD

The present invention relates to an ESD protection SCR device, and more particularly, to an SCR device for protecting an external device from electro-static discharge (hereinafter, referred as ESD), capable of having a high holding voltage and a high electrostatic discharge immunity.

BACKGROUND

Generally, devices such as a thyristor, a DMOS transistor (Double-diffusion MOS transistor), or a bipolar transistor are used as a high-voltage ESD protection device. An SCR (Silicon Controlled Rectifier) device, one typical example of the thyristor device, is composed of an anode and a cathode, and charges in the SCR device can move in a lateral direction.

FIG. 1 is a cross sectional view illustrating a conventional ESD protection SCR device.

Referring to FIG. 1, a conventional ESD protection SCR device includes an n-type deep well 15, a first well 20 and a second well 25. The n-type deep well 15 is formed on an upper surface of a p-type semiconductor substrate 10. N-type impurities are implanted into a left portion of the n-type deep well 20 to form the first well 15, whereas p-type impurities are implanted into a right portion of the n-type deep well 15 to form the second well 25. A region in which the first well 20 is formed corresponds to an anode region, whereas a region in which the second well 25 is formed corresponds to a cathode region.

Further, n-type and p-type impurities are implanted into the first well 20 to form an n-type impurity region 30 and a p-type impurity region 35, respectively, which are both connected to an anode terminal. On the other hand, p-type and n-type impurities are implanted into the second well 25 to form a p-type impurity region 40 and an n-type impurity region 45, respectively, which are both connected to a cathode terminal.

N-type impurities are implanted into one side of the p-type impurity region 35 in the first well 20 to form an n-type impurity region 50 floating without being connected to the anode terminal, whereas p-type impurities implanted into one side of the n-type impurity region 45 in the second well 25 to form an p-type impurity region 55 floating without being connected to the cathode terminal.

A device isolation layer 60 is provided to separate the impurity regions 30, 35, 40, 45, 50, and 55 from each other. The ESD protection SCR device 1 is formed in a bilaterally symmetrical structure with respect to the p-type impurity region 40. In order to use the ESD protection SCR device 1 as an electrostatic discharge protection device, the anode terminal is connected to a VDD terminal, and the cathode terminal is connected to a ground terminal.

The ESD protection SCR device 1 can be utilized for protecting a semiconductor device from static electricity, and when the electrostatic voltage is applied at high levels such as 2 kV or more, the SCR device 1 can rapidly drain out the electrostatic current to the ground terminal. Therefore, in order for the ESD protection SCR device 1 to function as an electrostatic discharge protection device, both a first trigger voltage at which the ESD protection SCR device 1 operates, and a second trigger voltage at which the ESD protection SCR device 1 breaks down due to heat generation must be lower than a breakdown voltage of internal circuits that make up the device 1, and the holding voltage which corresponds to a lowered voltage after the ESR protection SCR device 1 is triggered, should be lower than an operating voltage of the internal circuits.

Typically, the ESD-protection SCR device has relatively a low holding voltage due to its structural characteristics, which can lead to undesired latch-up problems due to over-voltage and noise other than ESD under normal operating conditions. The ESD protection SCR device 1 shown in FIG. 1 has the holding voltage higher than that of the typical ESD protection SCR device, but still has a limitation in securing a holding voltage of over 30 V or more and a high voltage resistance. Further, when the ESD protection SCR device 1 is implemented to an actual chip, a trigger voltage or a holding voltage along a parasitic path due to an interaction with adjacent components is lower than the trigger voltage or the holding voltage of the ESD protection SCR device 1, which may cause a problem that an operation of the ESD protection SCR device 1 is distorted.

SUMMARY

Example embodiments of the present invention provide ESD protection SCR devices having a high holding voltage and a high electrostatic discharge resistance, respectively.

According to an example embodiment of the present invention, an ESD protection SCR device includes a semiconductor substrate of p-type conductivity, an epitaxial layer of p-type conductivity, formed on the semiconductor substrate, device isolation layers formed on un upper surface portion of the epitaxial layer to divide the epitaxial layer into an anode region and a cathode region, an n-type well formed in the anode region of the epitaxial layer, a first high concentration p-type impurity region formed on a surface portion of the n-type well and connected to an anode terminal, a first high concentration n-type impurity region formed on the surface portion of the n-type well so as to surround both side portions of the first high concentration p-type impurity region, a p-type well formed in the cathode region of the epitaxial layer, a second high concentration n-type impurity region formed on a surface portion of the p-type well and connected to a cathode terminal, a second high concentration p-type impurity region formed on a surface portion of the p-type well so as to be spaced apart from the second high concentration n-type impurity region and connected to the cathode, and a third high-concentration p-type impurity region formed on the surface portion of the p-type well so as to surround a side portion of the second high-concentration n-type impurity region, adjacent to the anode region.

In an example embodiment, the n-type well has a ring structure to surround the p-type well.

In an example embodiment, one portion of the first high concentration n-type impurity region, which is formed distant from the cathode region may have a width larger than that of another portion of the first high concentration n-type impurity region, which is formed adjacent to the cathode region.

In an example embodiment, the epitaxial layer may further include a P-body region formed in a portion of the surface portion of the first p-type well and under the third high p-type impurity region.

In an example embodiment, the ESD protection SCR device may further include n-type drift ion regions formed at side portions of the first type well.

In an example embodiment, the epitaxial layer may further include an n-type deep well formed under the first n-type well.

In an example embodiment, the ESD protection SCR device may further include an n-type buried layer formed under the n-type deep well and along an interface between the epitaxial layer and the semiconductor substrate.

In an example embodiment, the epitaxial layer may further include an n-type deep well formed under both the first n-type well and the first p-type well.

In an example embodiment, the ESD protection SCR device may further include n-type drift ion regions formed at side portions of the first type well, and a gate formed between one of the n-type drift ion regions and the third high concentration p-type impurity region and on both the first p-type well and one of the device isolation layer.

In an example embodiment, the epitaxial layer may further include a P-body region formed under both the gate and the third high p-type impurity region In an example embodiment, the device isolation layers may divide the epitaxial layer into a P-Sub region additionally, the ESD protection SCR device may further include a second p-type well formed in the P-Sub region of the epitaxial layer and a fourth high concentration p-type impurity region formed on a surface portion of the second p-type well to be connected to a P-Sub terminal.

In an example embodiment, the second p-type well may have a ring structure to surround the first n-type well and the first p-type well.

According to example embodiments of the ESD protection SCR device, the first high-concentration p-type impurity region is connected to the anode terminal, but the first high-concentration n-type impurity region is not connected to the anode terminal to become floated. By floating the first high concentration n-type impurity region, a base resistance of the parasitic PNP can be increased to reduce the trigger voltage. Therefore, in the ESD protection SCR device, a first trigger voltage becomes lower than a second trigger voltage, so that the ESD protection SCR device can operate stably.

In the ESD protection SCR device, the first high-concentration n-type impurity region has a ring structure and surrounds side surface portion of the first high-concentration p-type impurity region. The first high concentration n-type impurity region is located in a periphery of the first high concentration p-type impurity region, so that holes injected from the anode terminal cannot flow to an interface between the device isolation layers and the epitaxial layer. Therefore, the interface can be prevented from being damaged by the holes, and the second trigger voltage can increase in the ESD protection SCR device to secure a high second trigger current.

According to the ESD protection SCR device in an example embodiment of the present invention, holes are recombined with electrons in the first high concentration n-type impurity region before holes ejected from the first high concentration p-type impurity region are collected through the first n-type well to the semiconductor substrate. Therefore, a gain of the vertical PNP can be reduced to increase the holding voltage.

According to the ESD protection SCR device in an example embodiment of the present invention, the first high concentration n-type impurity region has a width in the direction of the P-sub region larger than a width in the direction of the cathode region, so that the holding voltage of the parasitic path becomes higher than that of a cathode directional path (PNPN). Therefore, even if the parasitic operation which the ESD protection SCR device and the peripheral device occurs, the operation of the cathode directional path takes priority over the operation of the parasitic path to suppress the operation of the parasitic path, and the operation of the ESD protection SCR device can be stabilized.

According to the ESD protection SCR device in an example embodiment of the present invention, the second p-type well has a ring structure and is formed so as to surround the first n-type well and the first p-type well such that the fourth high-Structure. Since the fourth high concentration p-type impurity region has a ring structure, the internal operation of the ESD protection SCR device can be given priority over the parasitic operation with the peripheral device. Therefore, the operation of the ESD protection SCR device can be further stabilized.

In addition, a width of the fourth high concentration p-type impurity region can be adjusted to control the magnitude of the holding voltage. As the holding voltage increases, the immunity characteristics of the ESD protection SCR device can be improved.

BRIEF DESCRIPTION OF THE DRAWINGS

Example embodiments can be understood in more detail from the following description taken in conjunction with the accompanying drawings, in which.

DETAILED DESCRIPTION OF THE DRAWINGS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, layers, regions or plates may also be present. Unlike this, it will also be understood that when a layer, a layer, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same or similar meaning to that which is generally understood by those skilled in the art.

The depicted embodiments are described with reference to schematic diagrams of some embodiments of the present invention, which are not necessarily drawn to scale. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 1:
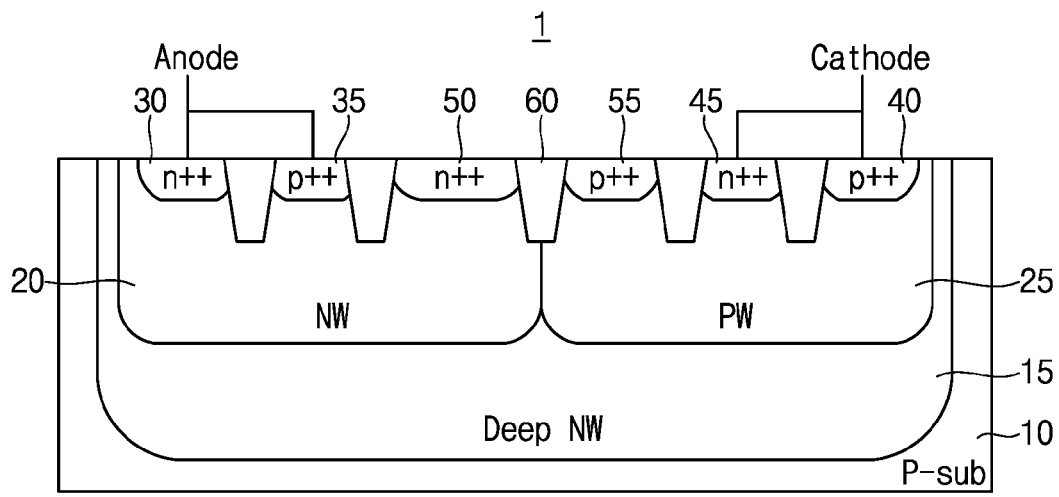
FIG. 1 is a cross sectional view illustrating a conventional ESD protection SCR device.
Figure 2:
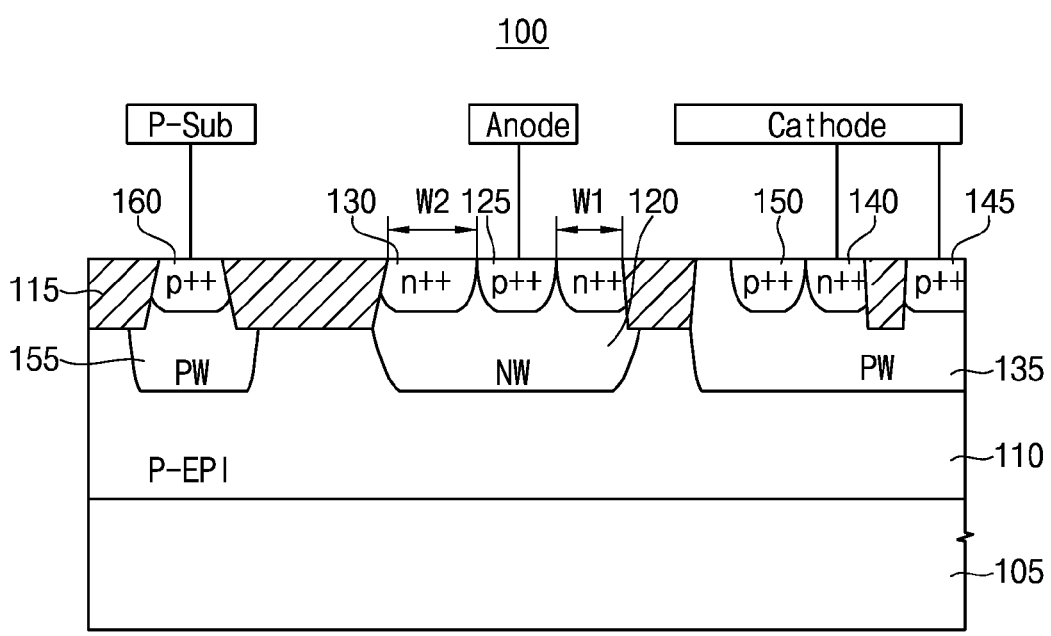
FIG. 2 is a cross sectional view illustrating an ESD protection SCR device in accordance with an example embodiment.

FIG. 2 is a cross sectional view illustrating an ESD protection SCR device in accordance with an example embodiment of the present invention.

Referring to FIG. 2, according to an example embodiment of the present invention, an ESD protection SCR device 100 includes a semiconductor substrate 105 of p-type conductivity, an epitaxial layer 110 of p-type conductivity, device isolation layers 115 shown with hatching in FIG. 2, a first n-type well 120, a first p-type well 135, a first p-type high concentration impurity region 125, a first n-type high concentration impurity region 130, a second n-type high concentration impurity region 140, a second p-type high concentration impurity region 145 and a third p-type high-concentration impurity region 150.

The epitaxial layer 110 is formed on the semiconductor substrate 105. The epitaxial layer 110 may be formed by an epitaxial growth process.

The device isolation layers 115 are formed on the epitaxial layer 110 to define an anode region, a cathode region and a P-Sub region. In the ESD protection SCR device 100, the cathode region may be located on an innermost side and the P-Sub region may be located on the outermost side.

The device isolation layers 115 may have a Shallow Trench Isolation (STI) structure or a Local Oxidation of Silicon (LOCOS) structure. The device isolation layers 115 may be formed using oxide.

The first n-type well 120 is provided at a certain depth in the anode region of the epitaxial layer 110. The first n-type well 120 may have a depth higher than that of the device isolation layers 115. The first n-type well 120 has n-type conductivity in the embodiment shown in FIG. 2.

The first high concentration p-type impurity region 125 is formed by implanting high-concentration p-type impurities into a surface portion of the first n-type well 120 to a predetermined depth. The first high concentration p-type impurity region 125 is connected to an anode terminal.

The first high concentration n-type impurity region 130 is formed by implanting high-concentration n-type impurities into the surface portion of the first n-type well 120 to a predetermined depth. The first high concentration n-type impurity region 130 can be floated without being connected to the anode terminal. By floating the first high concentration n-type impurity region 130, a base resistance of a parasitic PNP junction can increase to reduce a first trigger voltage. Therefore, according to an example embodiment of the ESD protection SCR device 100, the first trigger voltage becomes lower than a second trigger voltage, so that the SCR device 100 for ESD protection can operate stably.

When the first high concentration n-type impurity region 130 is connected to the anode terminal, the first trigger voltage may be increased.

The first high concentration n-type impurity region 130 may have a ring structure and may be formed to surround a side portion of the first high concentration p-type impurity region 125. Since the first high concentration n-type impurity region 130 is located around the first high concentration p-type impurity region 125, holes injected from the anode terminal cannot flow along an interface between the device isolation layers 115 and the epitaxial layer 110. Therefore, it is possible to prevent the interface between the device isolation layers 115 and the epitaxial layer 110 from being damaged by the holes.

In addition, since damage is suppressed at the interface between the device isolation layers 115 and the epitaxial layer 110, the ESR protection SCR device 100 may increase the second trigger voltage (i.e., the voltage at which ESR protection SCR device 100 will break down due to excess voltage) to secure a high second trigger current.

Before the hole introduced from the first high concentration p-type impurity region 125 is collected through the first n-type well 120 into the semiconductor substrate 105, the holes are recombined with electrons in the first high concentration n-type impurity region 130. Therefore, a gain of the vertical PNP can be reduced to increase a holding voltage.

The first high concentration n-type impurity region 130 may include one portion having a second width W2, distant from the cathode region, and another portion having a first width W1, adjacent to the cathode region. The one portion of the first high concentration n-type impurity region 130 which is positioned close to a P-Sub region has the second width W2 larger than the width W1.

A width of the first high concentration n-type impurity region 130 may affect to a value of the holding voltage. That is, as the width of the first high concentration n-type impurity region 130 is larger, the holding voltage becomes higher. The second width W2 of the first high concentration n-type impurity region 130 adjacent to the P-Sub region is wider than the width W1 of the first high concentration n-type impurity region 130 adjacent to the cathode region such that the holding voltage of a parasitic path in the ESD protection SCR device 100 can be higher than that of a cathode directional path (PNPN) along a direction toward the cathode region.

Therefore, even if parasitic operation between the ESD protection SCR device 100 and peripheral devices occurs, an operation of the cathode directional path takes priority over an operation of the parasitic path, thereby suppressing the operation of the parasitic path. That is, an internal operation of the ESD protection SCR device 100 can take priority over the parasitic operation of the peripheral devices, so that the operation of the ESD protection SCR device 100 can be stabilized.

The first p-type well 135 is formed at a predetermined depth in the cathode region of the epitaxial layer 110. For example, the first p-type well 135 has a depth larger than that the device isolation layers 115. The first p-type well 135 may have p-type conductivity.

High-concentration n-type impurities are implanted into a surface portion of the first p-type well 135 to a predetermined depth to form the second high-concentration n-type impurity region 140. The second high concentration n-type impurity region 140 is connected to a cathode terminal.

High-concentration p-type impurities are implanted into the surface portion of the first p-type well 135 to a predetermined depth to form the second high-concentration n-type impurity region 145. The second high concentration p-type impurity region 145 is connected to a cathode terminal.

The second high-concentration p-type impurity region 145 is located closer to a center of the semiconductor substrate 105 than the second high-concentration n-type impurity region 140 is. Further, the second high-concentration p-type impurity region 145 can be spaced apart from the second high-concentration n-type impurity region 140. For example, one of the device isolation layers 115 may be located between the second high concentration n-type impurity region 140 and the second high concentration p-type impurity region 145.

High-concentration p-type impurities are implanted into the first p-type well 135 to a certain depth to form the third high concentration p-type impurity region 150. The third high concentration p-type impurity region 150 can be floated without being connected to the cathode terminal. The third high concentration p-type impurity region 150 is disposed adjacent to the second high concentration n-type impurity region 140 and surrounds a side portion of the second high concentration n-type impurity region 140, which is adjacent to the anode region. Thus, the third high concentration p-type impurity region 150 can increase the holding voltage.

In an example embodiment, the first n-type well 120 has a ring structure and is formed to surround the first p-type well 135. Accordingly, the first n-type well 120 may serve to block a leakage current which may occur in the first p-type well 135.

The second p-type well 155 is formed at a certain depth in the P-Sub region of the epitaxial layer. For example, the second p-type well 155 has a depth larger than that the device isolation layers 115. The second p-type well 155 may have p-type conductivity.

The fourth high-concentration p-type impurity region 160 is formed by implanting high-concentration p-type impurities into a surface portion of the second p-type well 155 to a certain depth. The fourth high concentration p-type impurity region 160 is connected to the P-Sub terminal.

The second p-type well 155 has a ring structure and may be formed to surround both the first n-type well 120 and the first p-type well 135. Therefore, the fourth high concentration p-type impurity region 160 may have the ring structure identical to that of the second p-type well 155. Since the fourth high concentration p-type impurity region 160 has a ring structure, an internal operation of the ESD protection SCR device 100 can take priority over the parasitic operation with the peripheral devices. Therefore, the operation of the ESD protection SCR device 100 can be further stabilized.

The width of the fourth high concentration p-type impurity region 160 can be adjusted according to the value of the required holding voltage. For example, when a holding voltage of about 20 V or more is required, the fourth high-concentration p-type impurity region 160 can have a width of about 2 μm or more, and when a holding voltage of about 30 V or more is required, the fourth high-concentration p-type impurity region 160 can have a width of about 4 μm or more, and when a holding voltage of about 40V or more is required, the fourth high concentration p-type impurity region 160 can have a width of about 6 μm or more.

Figure 3:
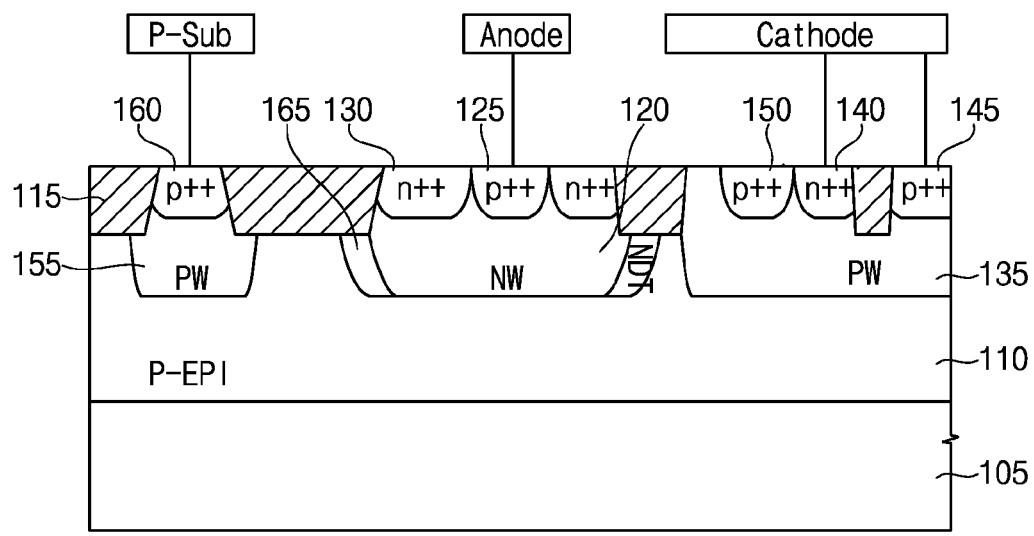
FIGS. 3 and 9 are cross sectional views illustrating ESD protection SCR devices in accordance with example embodiments
Figure 9:
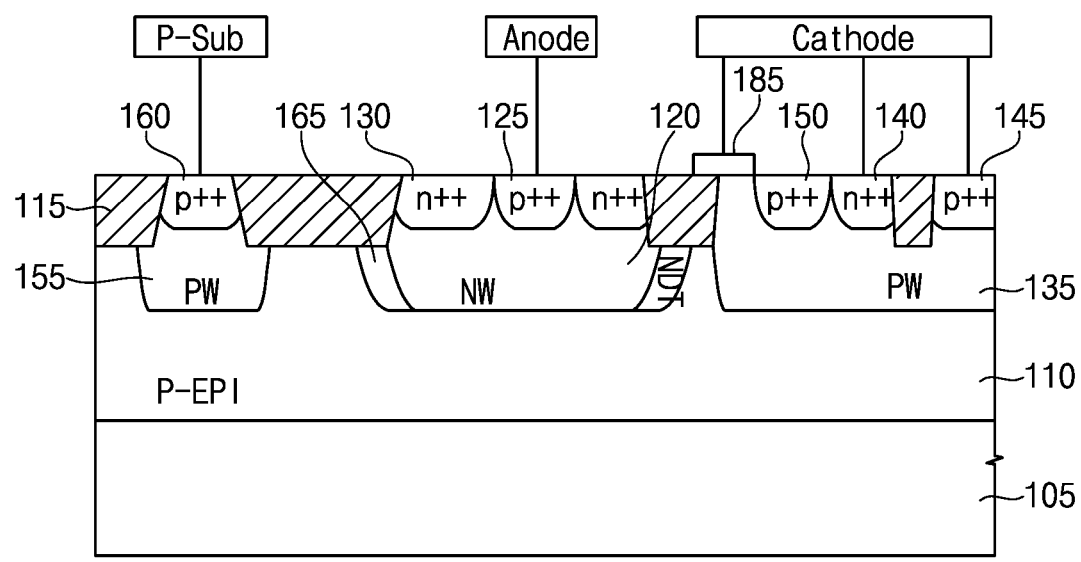

FIGS. 3 and 9 are cross sectional views illustrating ESD protection SCR devices in accordance with example embodiments of the present invention Referring to FIG. 3, according to an example embodiment, an ESD protection SCR device 100 includes a semiconductor substrate 105 of p-type conductivity, an epitaxial layer 110 of p-type conductivity, device isolation layers 115, a first n-type well 120, a first p-type well 135, a first p-type high concentration impurity region 125, first n-type high concentration impurity regions 130, a second n-type high concentration impurity region 140, a second p-type high concentration impurity region 145 and the third p-type high-concentration impurity region 150.

The ESD protection SCR device 100 may further include an n-type drift ion region 165 (NDT).

The n-type drift ion region 165 is disposed on both side portions of the first n-type well 120 to at least partially surround n-type well 120. The n-type drift ion region 165 may be located under the device isolation layers 115. The impurity concentration of the n-type drift ion region 165 may be lower than that of the first n-type well 120.

A width of the n-type drift ion region 165 is controlled to adjust both a distance between the n-type drift ion region 165 formed in the first n-type well 120 and the first p-type well 135, and a distance between the drift ion region 165 formed in the first n-type well 120 and the second p-type well 155. By adjusting both the distance between the n-type drift ion region 165 formed in the first n-type well 120 and the first p-type well 135, and the distance between the drift ion region 165 formed in the first n-type well 120 and the second p-type well 155, the second trigger voltage and the first trigger voltage can be adjusted. Therefore, the n-type drift ion region 165 can be utilized to adjust the second trigger voltage and the first trigger voltage.

Figure 4:
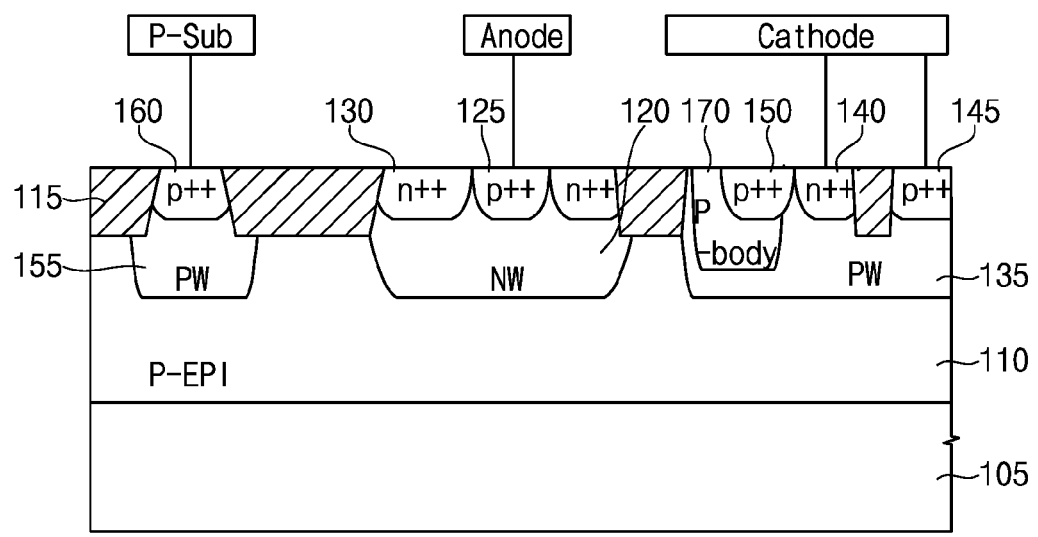

Referring to FIG. 4, an ESD protection SCR device 100 may further include a P-body region 170. A P-body region 170 can be used either alone (as shown in FIG. 4), or in combination with the NDT regions previously described and depicted with respect to FIG. 3, and as described in more detail below with respect to FIG. 5.

High concentration p-type impurities are implanted into both a portion of a surface portion positioned between a third high concentration p-type impurity region 150 and a device isolation layer 115 adjacent to the third high concentration p-type impurity region 150, and under the third high p-type impurity region 150 to form the P-body region 170.

Since the ESD protection SCR device further includes the P-body region 170 in the fifth impurity region 150, an N/P recombination can be promoted to reduce a gain of the parasitic NPN such that a holding voltage may increase.

Figure 5:
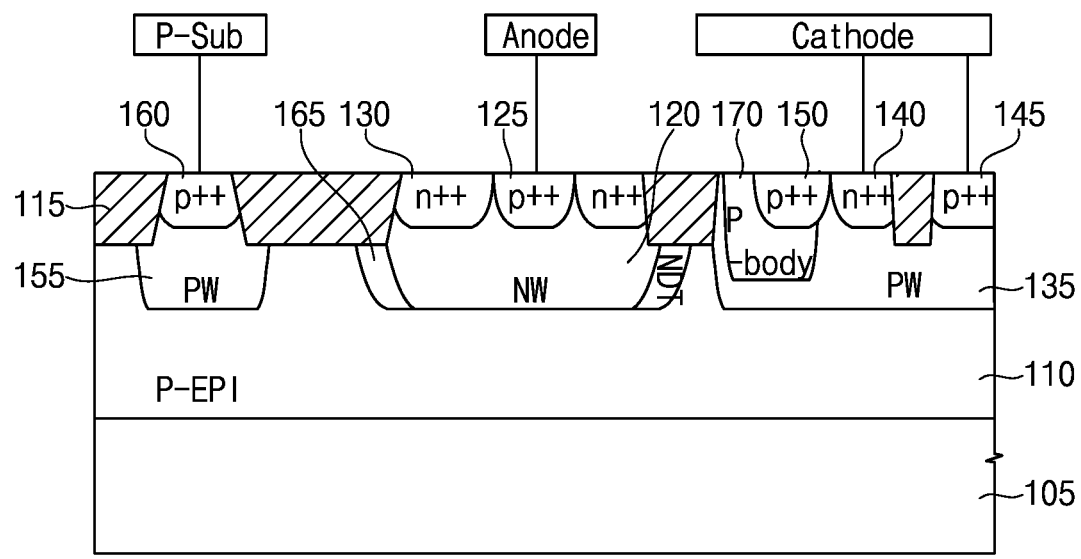

Referring to FIG. 5, an ESD protection SCR device 100 may further include an n-type drift ion region 165 and a P-body region 170.

Thus, the n-type drift ion region 165 can be used to adjust a second trigger voltage and a first trigger voltage, and the P-body region 170 can be used to increase a holding voltage.

Figure 6:
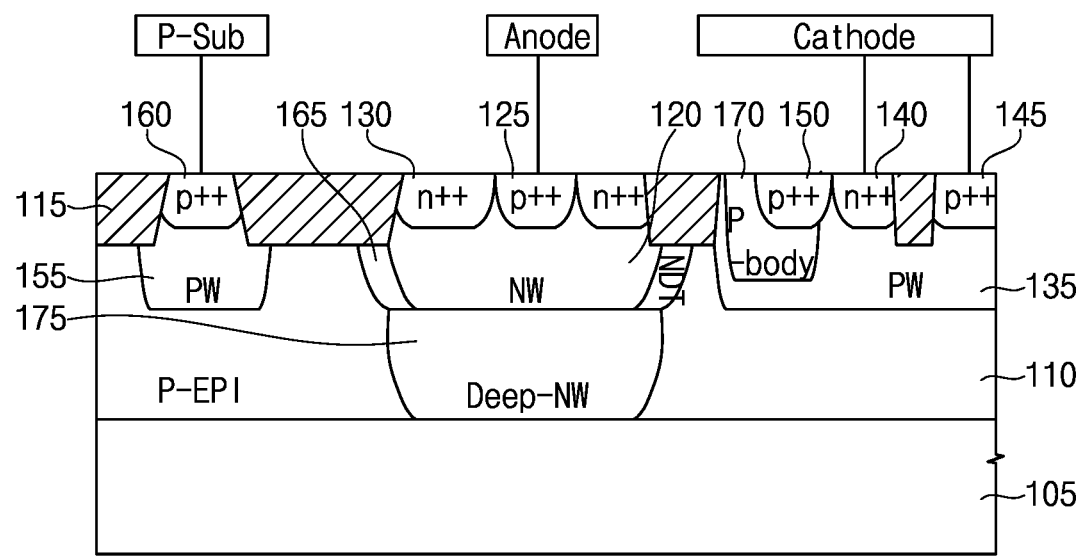

Referring to FIG. 6, an ESD protection SCR device 100 may further include an n-type drift ion region 165, a p-body region 170, and an n-type deep well 175. In alternative embodiments, n-type deep well 175 can be implemented in embodiments that do not include either the n-type drift ion region 165, the p-body region 170, or both.

The n-type deep well 175 may be formed in an epitaxial layer 110 and below a first n-type well 120. Specifically, the n-type deep well 175 may be formed in the epitaxial layer 110, below the first n-type well 120 and an n-type drift ion region 165.

Figure 7:
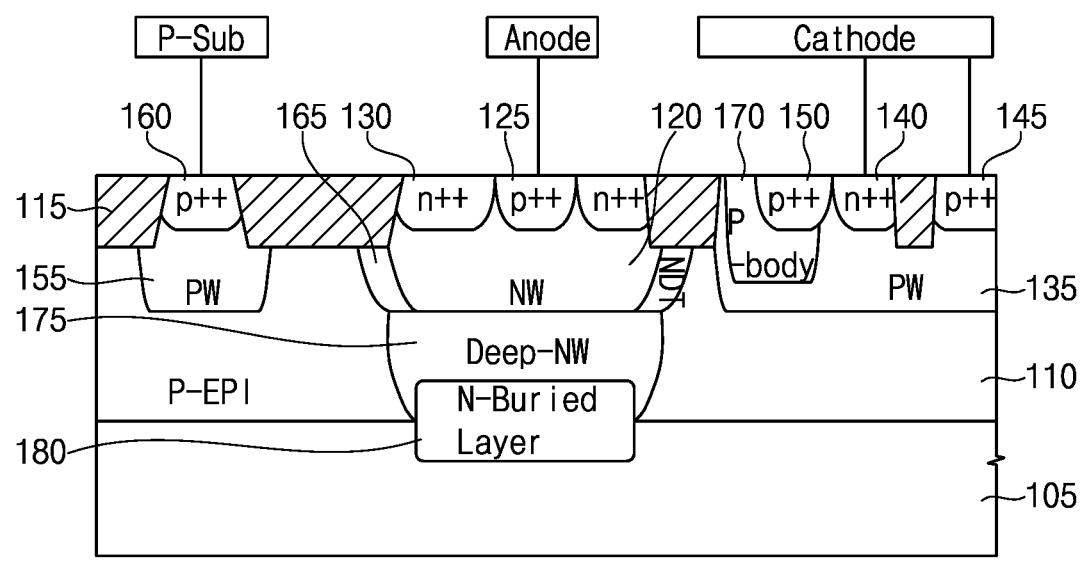

Referring to FIG. 7, an ESD protection SCR device 100 may further include an n-type drift ion region 165, a P-body region 170, an n-type deep well 175 and an n-type buried layer 180. In alternative embodiments, n-type deep well 175 can be implemented in embodiments having an n-type buried layer 180, but without one or both of the n-type drift ion region 165 and/or the P-body region 170.

The n-type buried layer 180 may be formed under the n-type deep well 175 along an interface between an epitaxial layer 110 and a semiconductor substrate 105.

Figure 8:
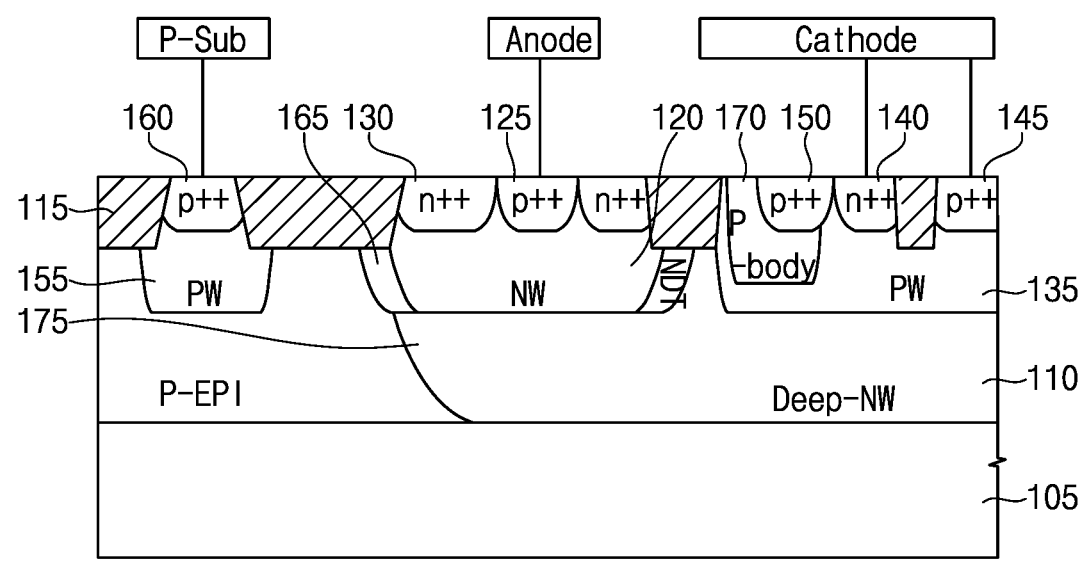

Referring to FIG. 8, an ESD protection SCR device 100 may further include an n-type drift ion region 165, a p-body region 170, and an n-type deep well 175.

The n-type deep well 175 may be formed in an epitaxial layer 110 under a lower portion of a first n-type well 120 and a lower portion of a first p-type well 135. As shown by the contrast between FIGS. 7 and 8, the deep n-well 175 can have a variety of sizes, shapes, and depths based upon the desired electronic features of the ESD protection SCR device 100.

Referring to FIG. 9, an ESD protection SCR device 100 may further include an n-type drift ion region 165 and a gate 185.

The gate 185 of FIG. 9 is formed on both a portion of a surface of a first p-type well 135 located between an n-type drift ion region 165 and an third high concentration p-type impurity region 150, and a portion of a surface of the device isolation layers 115. That is, the gate 185 can be disposed above a junction region between the n-type drift ion region 165 and the third high concentration p-type impurity region 150. Further, the gate 185 is connected to a cathode terminal.

Since the gate 185 has an effect of forming a current path, it is possible to prevent electric charges from concentrating on a lower portion of the device. That is, the gate 185 has a RESURF effect. Therefore, the n-type drift ion region 165 and the gate 185 can be provided to adjust a second trigger voltage.

On the other hand, although not shown, the gate 185 may be further included in the ESD protection SCR devices 100 shown in FIGS. 4 to 8, respectively, or with any combination of the features described therein.

As described above, the ESD protection SCR device can reduce the first trigger voltage lower than the second trigger voltage such that the second trigger voltage increases to secure a high second trigger current, and increase the holding voltage. Therefore, the ESD protection SCR device can operate stably.

In addition, the internal operation of the ESD protection SCR device may take priority over the parasitic operation with the peripheral devices. Therefore, the operation of the ESD protection SCR device can be further stabilized.

Although the super junction MOSFET has been described with reference to the specific embodiments, they are not limited thereto. Therefore, it will be readily understood by those skilled in the art that various modifications and changes can be made thereto without departing from the spirit and scope of the appended claims.

The invention claimed is:

1. An ESD protection SCR device comprising:
   a semiconductor substrate of p-type conductivity;
   an epitaxial layer of p-type conductivity arranged on the semiconductor substrate and defining an upper surface;
   a plurality of device isolation layers arranged on the upper surface to divide the epitaxial layer into an anode region and a cathode region;
   an n-type well arranged in the anode region of the epitaxial layer;
   a first high concentration p-type impurity region arranged on a surface portion of the n-type well and connected to an anode terminal;
   a first high concentration n-type impurity region arranged on the surface portion of the n-type well so as to at least partially surround the first high concentration p-type impurity region;
   a p-type well arranged in the cathode region of the epitaxial layer;
   a second high concentration n-type impurity region arranged on a surface portion of the p-type well and connected to a cathode terminal;
   a second high concentration p-type impurity region arranged on a surface portion of the p-type well so as to be spaced apart from the second high concentration n-type impurity region and connected to the cathode; and
   a third high-concentration p-type impurity region arranged on the surface portion of the p-type well so as to at least partially surround a side portion of the second high-concentration n-type impurity region, adjacent to the anode region.

2. The ESD protection SCR device of claim 1, wherein the n-type well has a ring structure to surround the p-type well.

3. The ESD protection SCR device of claim 1, wherein a first portion of the first high concentration n-type impurity region is arranged distant from the cathode region and has a width larger than a second portion of the first high concentration n-type impurity region arranged adjacent to the cathode region.

4. The ESD protection SCR device of claim 1, wherein the epitaxial layer further includes a P-body region arranged along the surface portion of the first p-type well and under the third high p-type impurity region.

5. The ESD protection SCR device of claim 1, further comprising n-type drift ion regions arranged at side portions of the first n-type well.

6. The ESD protection SCR device of claim 5, wherein the epitaxial layer further includes an n-type deep well arranged under the first n-type well.

7. The ESD protection SCR device of claim 6, further comprising an n-type buried layer arranged under the n-type deep well and along an interface between the epitaxial layer and the semiconductor substrate.

8. The ESD protection SCR device of claim 5, wherein the epitaxial layer further includes an n-type deep well formed under both the first n-type well and the first p-type well.

9. The ESD protection SCR device of claim 1, further comprising:
   n-type drift ion regions arranged at side portions of the first n-type well; and
   a gate arranged between one of the n-type drift ion regions and the third high concentration p-type impurity region and on both the first p-type well and one of the device isolation layers.

10. The ESD protection SCR device of claim 1, wherein the epitaxial layer further includes a P-Body region arranged under both the gate and the third high p-type impurity region.

11. The ESD protection SCR device of claim 1, wherein the device isolation layers divide the epitaxial layer into a P-Sub region additionally, further comprising:
    a second p-type well arranged in the P-Sub region of the epitaxial layer; and
    a fourth high concentration p-type impurity region arranged on a surface portion of the second p-type well and connected to a P-Sub terminal.

12. The ESD protection SCR device of claim 11, wherein the second p-type well has a ring structure to surround the first n-type well and the first p-type well.

* * * * *